(12) United States Patent
Larosa et al.

(10) Patent No.: US 8,984,953 B2
(45) Date of Patent: Mar. 24, 2015

(54) SOLID STATE PRESSURE SENSOR

(71) Applicant: STMicroelectronics S.R.L

(72) Inventors: Manuela Larosa, Giarre (IT); Giovanni Sicurella, Catania (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 228 days.

(21) Appl. No.: 13/859,032

(22) Filed: Apr. 9, 2013

(65) Prior Publication Data
US 2013/0269443 A1 Oct. 17, 2013

(30) Foreign Application Priority Data
Apr. 16, 2012 (IT) .............................. MI2012A0617

(51) Int. Cl.
*G01L 9/00* (2006.01)
*H01L 29/66* (2006.01)
*G01L 9/04* (2006.01)
*G01L 9/06* (2006.01)

(52) U.S. Cl.
CPC ................ *G01L 9/0098* (2013.01); *G01L 9/04* (2013.01); *G01L 9/06* (2013.01); *H01L 29/66007* (2013.01); *G01L 9/0054* (2013.01)
USPC .......................................................... 73/754

(58) Field of Classification Search
None
See application file for complete search history.

(56) References Cited

U.S. PATENT DOCUMENTS

| | | | | |
|---|---|---|---|---|
| 3,323,358 | A | * | 6/1967 | Fraioli ....................... 73/862.68 |
| 4,905,575 | A | * | 3/1990 | Knecht et al. ............. 92/103 SD |
| 5,001,934 | A | * | 3/1991 | Tuckey ........................... 73/721 |
| 7,034,700 | B2 | * | 4/2006 | Kurtz et al. .................... 340/626 |
| 7,141,821 | B1 | * | 11/2006 | Yamazaki et al. ............... 257/69 |
| 8,905,772 | B2 | * | 12/2014 | Rogers et al. ................. 439/254 |
| 2008/0190207 | A1 | | 8/2008 | Yang |

FOREIGN PATENT DOCUMENTS

CN 201273848 7/2009

* cited by examiner

*Primary Examiner* — Andre Allen
(74) *Attorney, Agent, or Firm* — Allen, Dyer, Doppelt, Milbrath & Gilchrist, P.A.

(57) ABSTRACT

A solid state sensor to sense pressure includes a semiconductor substrate having a crystallographic design axis, and an odd number of identical inverter modules coupled in series to form a ring oscillator on the semiconductor substrate. Each inverter module includes a pair of structurally identical CMOS inverter stages. A logic input circuit starts oscillation of the ring oscillator and select a signal propagation path therein, either through CMOS inverter stage more affected by the induced mechanical stress or through CMOS inverter stages less affected by the pressure, using two logic command signals. The ring oscillator allows a reading of a frequency of oscillation based on the two logic command signals.

14 Claims, 8 Drawing Sheets

(A)

(B)

SOLID STATE PRESSURE SENSOR

FIELD OF THE INVENTION

This disclosure generally relates to solid state pressure sensors, and in particular, to a self-compensated stress sensitive semiconductor integrated circuit adapted to produce a quantitative measure of pressure or an equivalent load acting thereon.

BACKGROUND OF THE INVENTION

The piezoresistive behavior of integrated resistors and of piezo MOS transistors on silicon substrates is known, as disclosed in F. Fruett and G. C. M. Meijer, titled "The Piezojunction Effect In Silicon Integrated Circuits And Sensors," by Kluwer Academic Publishers. Sensitivity to stress is ordinarily investigated through measurements performed with special devices, designed ad hoc, like traditional resistor and transistor devices placed in a circular configuration, as shown in FIGS. 1 and 2, respectively.

Theoretical and experimental results on different diffused structures on silicon have been analyzed to provide design guidance for calculating and minimizing the sensitivity of traditional analog circuits to mechanical stress that is inevitably induced at many steps of any fabrication process of integrated circuits (ICs), and during the packaging processes. The packaging processes include die attachment and encapsulation. The induced stress can affect the behavior of both analog and digital circuits leading to malfunctioning of the devices.

A straightforward analog structure based on an NMOS differential pair is shown in FIG. 3. The drain current variation for parallel and orthogonal channel orientations with respect to the crystallographic axis of silicon has been measured. The effect of a load applied onto the (100) plane of the silicon crystal is illustrated in the figure. Reference is directed to the article by R. C. Jaeger et al., titled CMOS Stress Sensors on (100) Silicon, IEEE JOURNAL OF SOLID-STATE CIRCUITS, VOL. 35, NO. 1, JANUARY 2000 85 m. An analog amplifier is used to manage the signal coming from the sensor.

Though effective, the proposed solid state sensor circuits have non-negligible current absorption which make them hardly useful for close and far field EM coupling excitation of sensors intended to be permanently embedded in stress structures. Moreover, as disclosed in R. C. Jaeger et al., the alternative use of intrinsically low power absorption CMOS structures has the drawback of the marked influence of stress induced in the semiconductor crystal on carrier mobility. This interferes with a correct measurement of stress-induced drain current variations. Laborious correction algorithms would be required. A further drawback is the limited signal-to-noise ratio.

On a different account, important real-world applications of compression induced stress measurements in reinforced concrete structures may require transducer sensitivity from 30 to 500 $kg/cm^2$ and beyond with a good linearity of response. Generally, solid state pressure sensors are based on the use of MEMS structures (micro-machined silicon sensing elements) that make them relatively bulky and expensive.

Use of piezo MOSFETs as compressive stress detectors in devices containing near or far field powering and communication circuits to be embedded in concrete pillars has been proposed and is the subject of growing literature. Unfortunately, a reliable quantitative measure is hardly achievable and utility of these solid state permanently embedded devices is generally in providing an indication of an intervening shift from a previously recorded value gathered from the same compressive stress detector, when stimulated by a powering and reading external exciter-recorder instrument. This IT architecture may require a large database for storing information about the numerous sensors deployed for monitoring a large structure, like a building or a bridge.

SUMMARY OF THE INVENTION

An object of the present invention is to provide a solid state pressure sensor integrated circuit with enhanced sensitivity and linearity, and a broad pressure range.

The solid state pressure sensor exploits the differences of piezoresistive effect of integrated resistors and of MOS transistors with which paired basic CMOS inverter stages are formed on the semiconductor die in two different crystallographic orientations. These orientations include the longitudinal axis of integration of diffused resistors, and of channel areas oriented in the direction of the preferential crystallographic axis of the fabrication technology used, and at an angle from it, respectively.

The pair of identical inverter stages, the diffused resistances and transistor channels of which are oriented along (parallel to) the preferential crystallographic axis and along (parallel to) a crystallographic axis at an angle from it, for example, consider the crystallography and piezo-electric effects in silicon, at about 45° from it, respectively, and form a module of integration. This module of integration may be replicated several times on the semiconductor die. Each module provides two distinct signal paths through practically identical CMOS inverter stages. The electrical characteristics of each module are substantially unaffected and strongly affected, respectively, and will be referred to herein with the functional expression "inverter module".

The differences of the changes of electrical characteristics caused by the stress induced by pressure or an equivalent mechanical load on the semiconductor die in the two differently oriented, identical CMOS inverter stages of each inverter module are exploited by forming on the die two distinct ring oscillators. One may include the CMOS inverter stages of the first orientation, and the other may include the CMOS inverter stages of the second orientation to provide two signal path inverter modules that are selectable.

Basically, the solid state sensor monitors the pressure or equivalent mechanical load acting on an integrated circuit die by demodulating the frequency of oscillation of a CMOS ring oscillator.

According to one embodiment, the system may have a ring oscillator architecture implemented by forming a closed ring with an odd number of basic inverter modules, connected in a way to define two selectable distinct signal paths that use a digital enable signal for starting the oscillation applied to a first inverter module of the ring having a NAND input gate. Pressure and stress may be monitored through two digital control signals, namely an Enable signal and a Sense signal.

According to the above embodiment, the start of oscillation of the ring includes CMOS inverter stages having electrical characteristics strongly affected by mechanical stress is commanded by raising to High the Enable signal while keeping Low the Sense signal or the start of oscillation of the ring. The ring may include CMOS inverter stages having electrical characteristics substantially unaffected by mechanical stress, and may be commanded by raising to High both the Enable signal and the Sense signal for acquiring as an output a single oscillating signal.

This architecture allows power consumption to be reduced as a result of using CMOS gates, and because of a greatly reduced computational complexity of sensor data processing.

DETAILED DESCRIPTION OF THE DRAWINGS

A description of embodiments of the present invention making reference to the annexed drawings will follow, with the aim of making clear to the skilled artisan manners in which the invention may be practiced, without any intended limitation of its practice to the sample embodiments shown and described in detail.

DETAILED DESCRIPTION OF THE PREFERRED EMBODIMENTS

Figure 1:
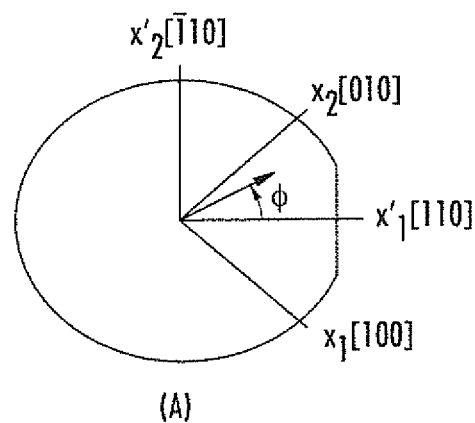
FIG. 1 shows in coordinates on a (100) plane of a common silicon wafer (a) and an optimized dual polarity resistance measurement circuit (b) in accordance with the prior art.
Figure 1:
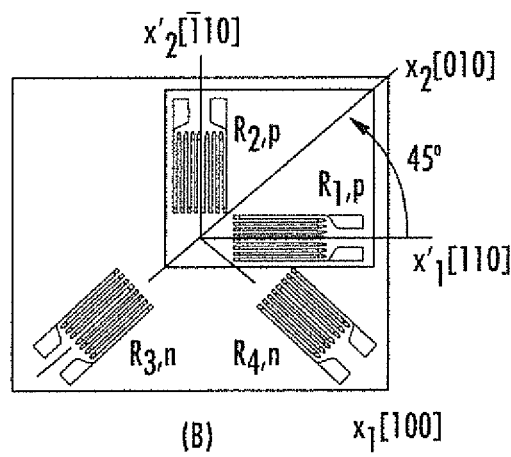
Figure 2:
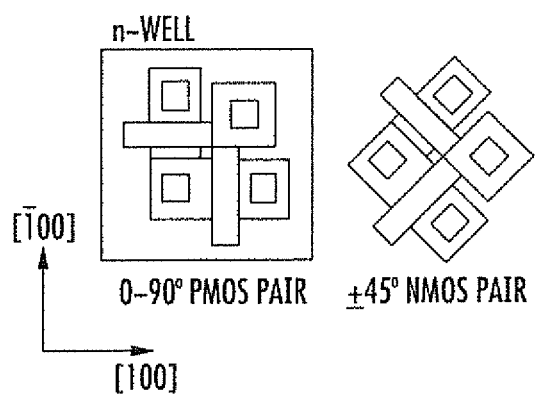
FIG. 2 shows the ordinary layout of a CMOS sensor rosette for (100) silicon in accordance with the prior art.
Figure 3:
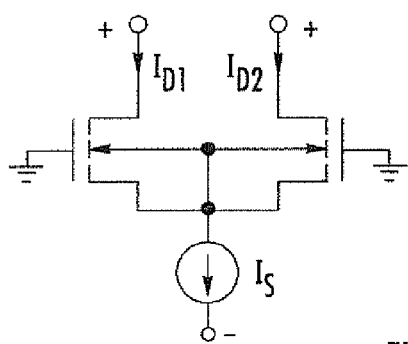
FIG. 3 shows an NMOS differential pair and relative stress induced drain current variation for parallel and orthogonal channel orientations in accordance with the prior art.
Figure 3:
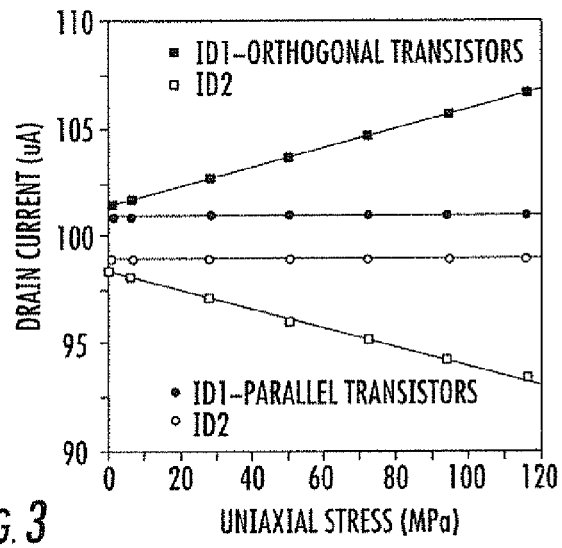
Figure 4:
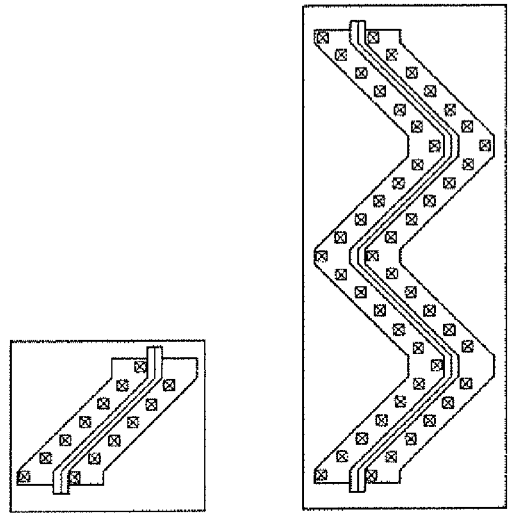
FIG. 4 shows layouts of NMOS transistors with an active area orientation at 45° of the standard design axis according to a sample embodiment of the invention.
Figure 5:
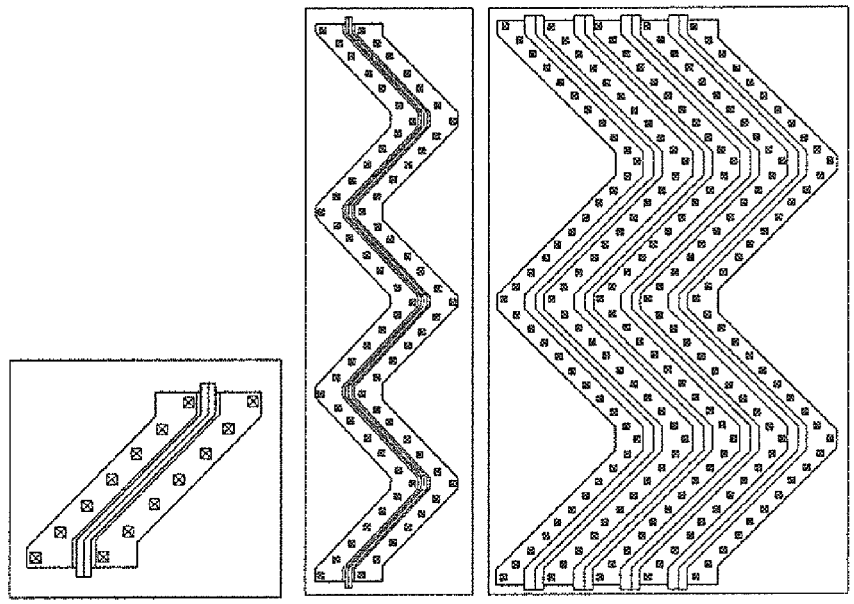
FIG. 5 shows layouts of PMOS transistors with an active area orientation at 45° of the standard design axis according to a sample embodiment of the invention.

FIG. 4 and FIG. 5 show layouts of NMOS and PMOS transistors with active area orientation at 45° of the normally preferred (standard) orientation used in the considered technology of fabrication. The channel width and length of which may be modularly designed starting from a basic integration module shown at the left on the respective figures. The module design may be easily implemented in CAD environments as parametric cells.

Figure 6:
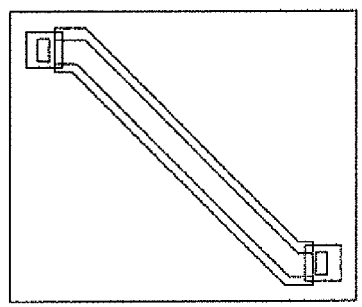
FIG. 6 shows layouts of a diffused resistor with an active area orientation at 45° of the standard design axis according to a sample embodiment of the invention.

As shown in FIG. 6, the same approach can be used to design integrated resistors with enhanced sensing capability compared with that of standard integrated resistors that normally have the longitudinal axis of their diffused region parallel to the preferred orientation axis in order to be the least sensitive as possible to mechanical stresses of the crystal.

Figure 7:
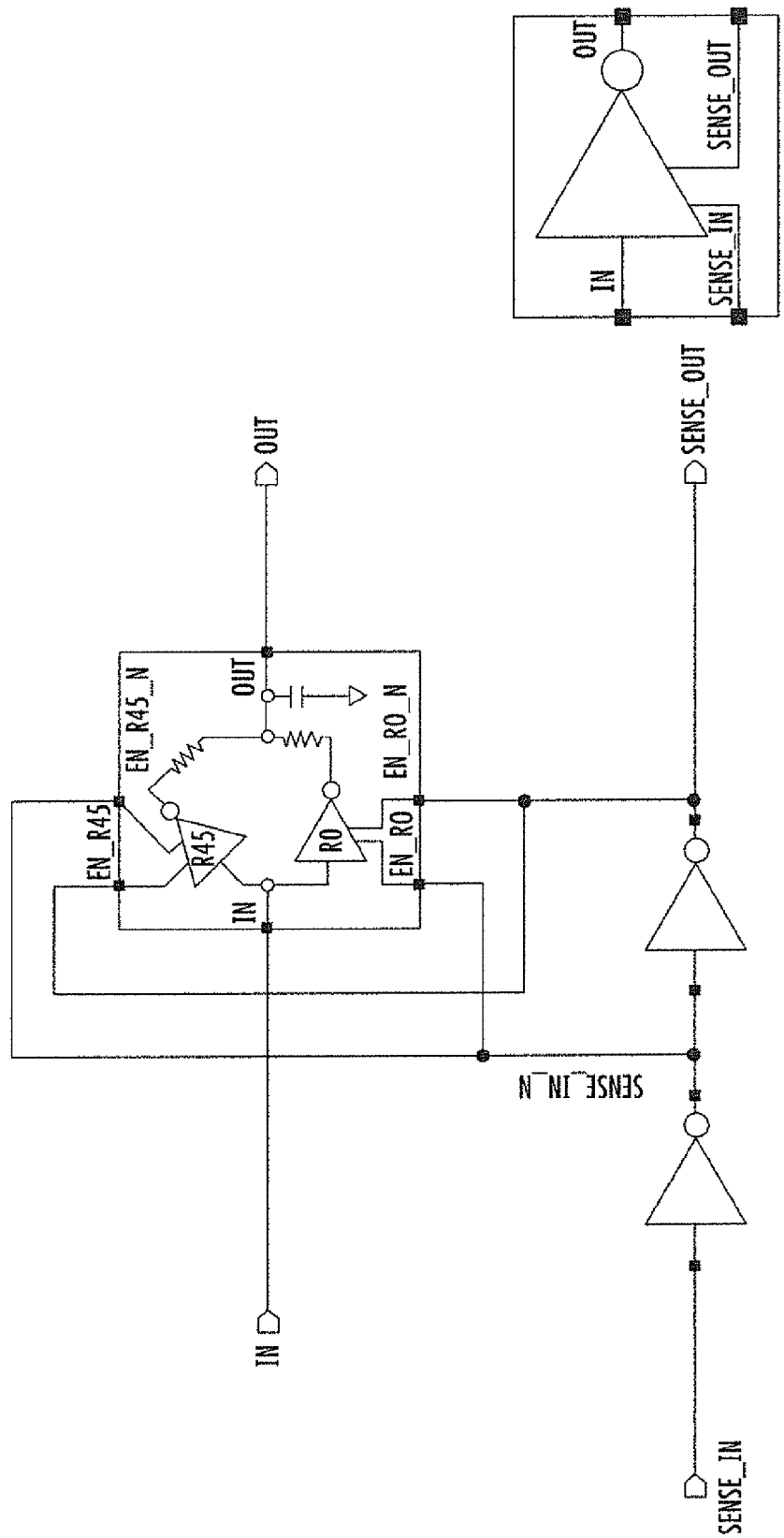
FIG. 7 shows a basic inverter module and related symbolic representation and control signals thereof, according to a first embodiment of the invention.

FIG. 7 shows a basic two distinct signal path inverter module and related symbolic representation along with its control signals, according to a first embodiment. Each inverter module has two CMOS inverter stages, R0 and R45, with a respective output series resistance of similar geometry and values and active areas (transistor channels and the resistors diffusions) of the devices that define the stage R0 oriented in the direction of the preferential crystallographic axis of the fabrication technology used, and those that define the stage R45 oriented at 45° from it.

In the embodiment shown, the devices drawn along the preferential crystallographic axis (stage R0) are not sensitive or slightly sensitive to mechanical stresses, and the devices drawn along the axis at 45° (stage R45) are strongly sensitive to mechanical stresses in the semiconductor crystal. The two structurally similar though differently oriented inverting structures are connected in parallel between a common signal input node and a common signal output node, and are adapted to be enabled in a mutually exclusive manner using only two logic control signals, namely an Enable (and start) and a Sense signal.

Figure 8:
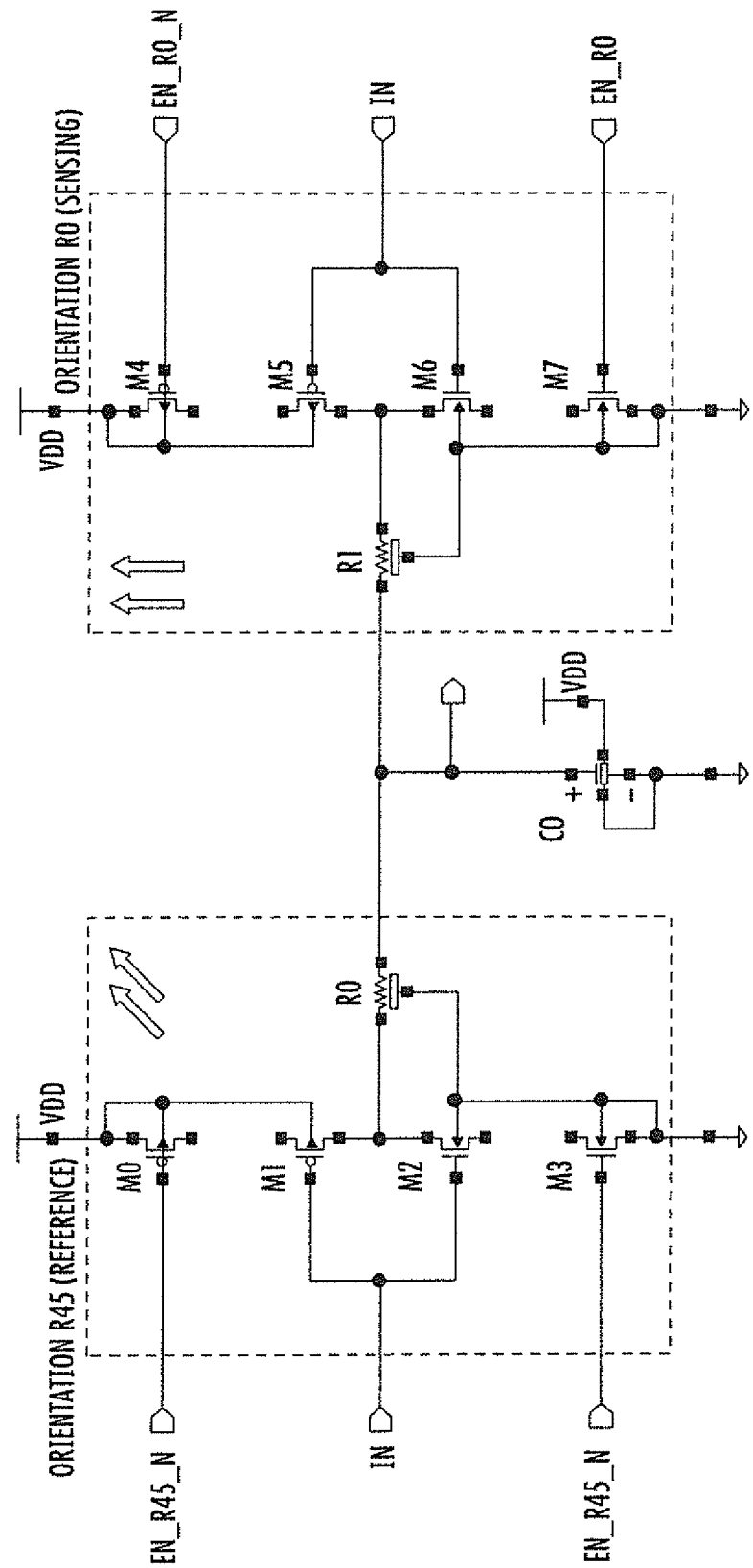
FIG. 8 shows a circuit diagram of the basic inverter module of FIG. 7 according to a sample embodiment.

With reference to the exemplary circuit diagram of FIG. 8, the inverter R45 on the left is realized with resistors, and PMOS and NMOS transistors integrated with orientation of their active areas at 45° of the preferential (standard) design orientation of the areas of the resistors, and PMOS and NMOS transistors that form the inverter R0 on the right of the diagram.

By connecting in series an odd number of basic inverter modules to form a closed ring, two selectable structurally identical ring oscillators, but including differently oriented CMOS transistors and related output resistors, are thus realized. They may be commonly started by applying a logic start signal to the input of an inverter module.

Therefore, a reference frequency generator function is co-integrated in each inverter module structure ensuring an enhanced matching of the two selectable inverting structures. Of course, optimal temperature compensation may also be provided without requiring any dedicated circuit. In normal conditions, each inverter of the sample circuit embodiment of FIG. 8 will have the same rise and fall times fixed by design.

When the die is subjected to pressure or an equivalent mechanical load, the left hand side inverter stage R45, made of transistors and resistors oriented at 45° to the preferential (standard) design orientation of the silicon crystal, will exhibit a faster transition time. This is due to the piezoelectric effects and related increase of carrier mobility that proportionately increases the frequency of oscillation of the respective ring oscillator. In contrast, the right hand side inverter R0, made of transistors and resistors oriented in the direction of the preferential crystallographic axis of silicon, is much less sensitive to the mechanical stresses induced in the silicon crystal. The respective ring oscillator is subject to a far lesser or quasi null increase of the frequency of oscillation. This provides a reliable reference frequency generator. The ratio between the oscillation frequencies of the two ring oscillators may therefore provide a quantitative measure of the stress inducing pressure or mechanical load acting on the die.

Figure 9:
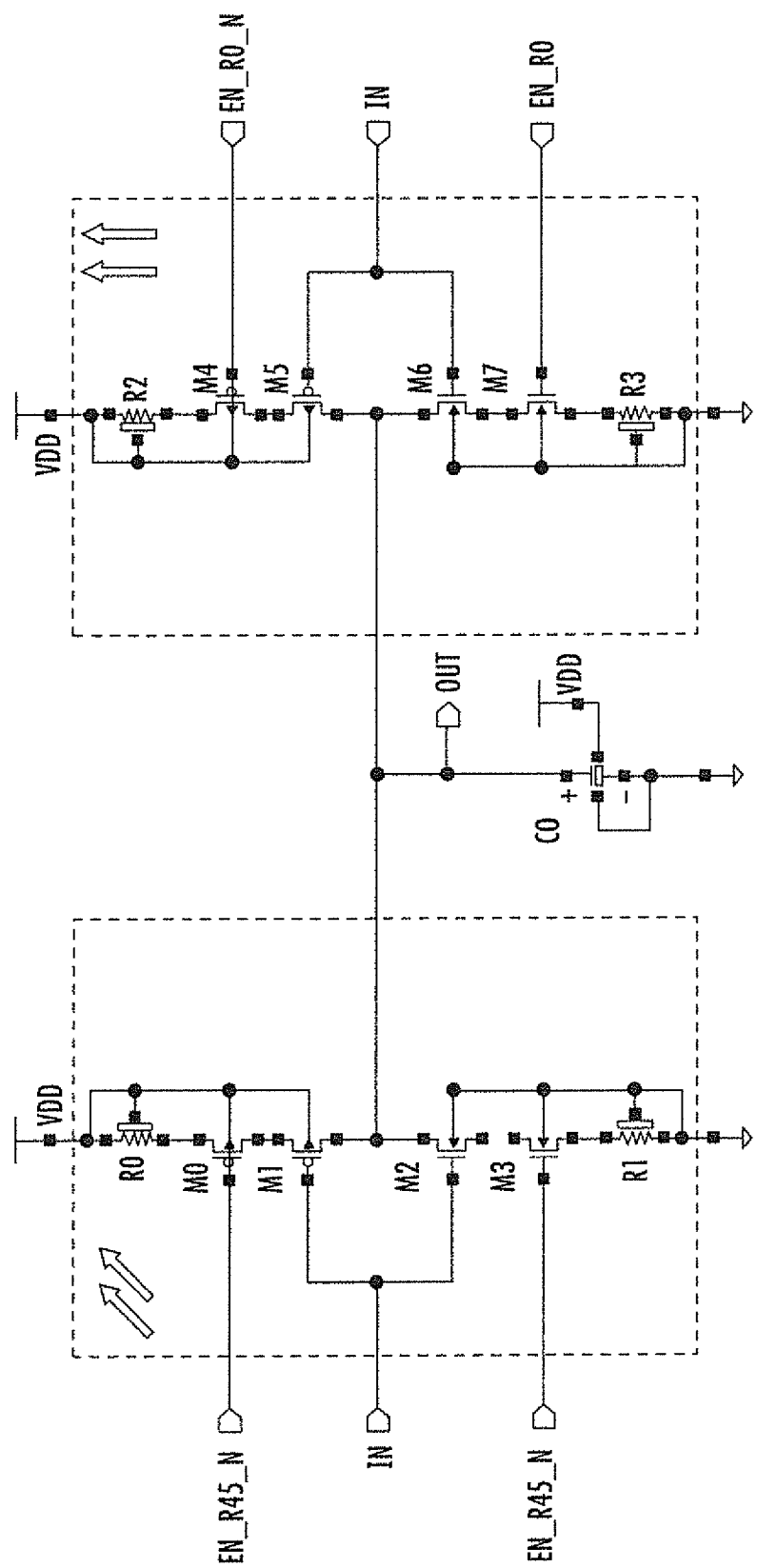
FIG. 9 shows a circuit diagram of the basic inverter module of FIG. 7 according to a different sample embodiment.

FIG. 9 shows an alternative exemplary embodiment of the two CMOS inverter stages with respective output series resistances of similar geometry and values, but with different spatial orientations with respect to the inverter module.

Figure 10:
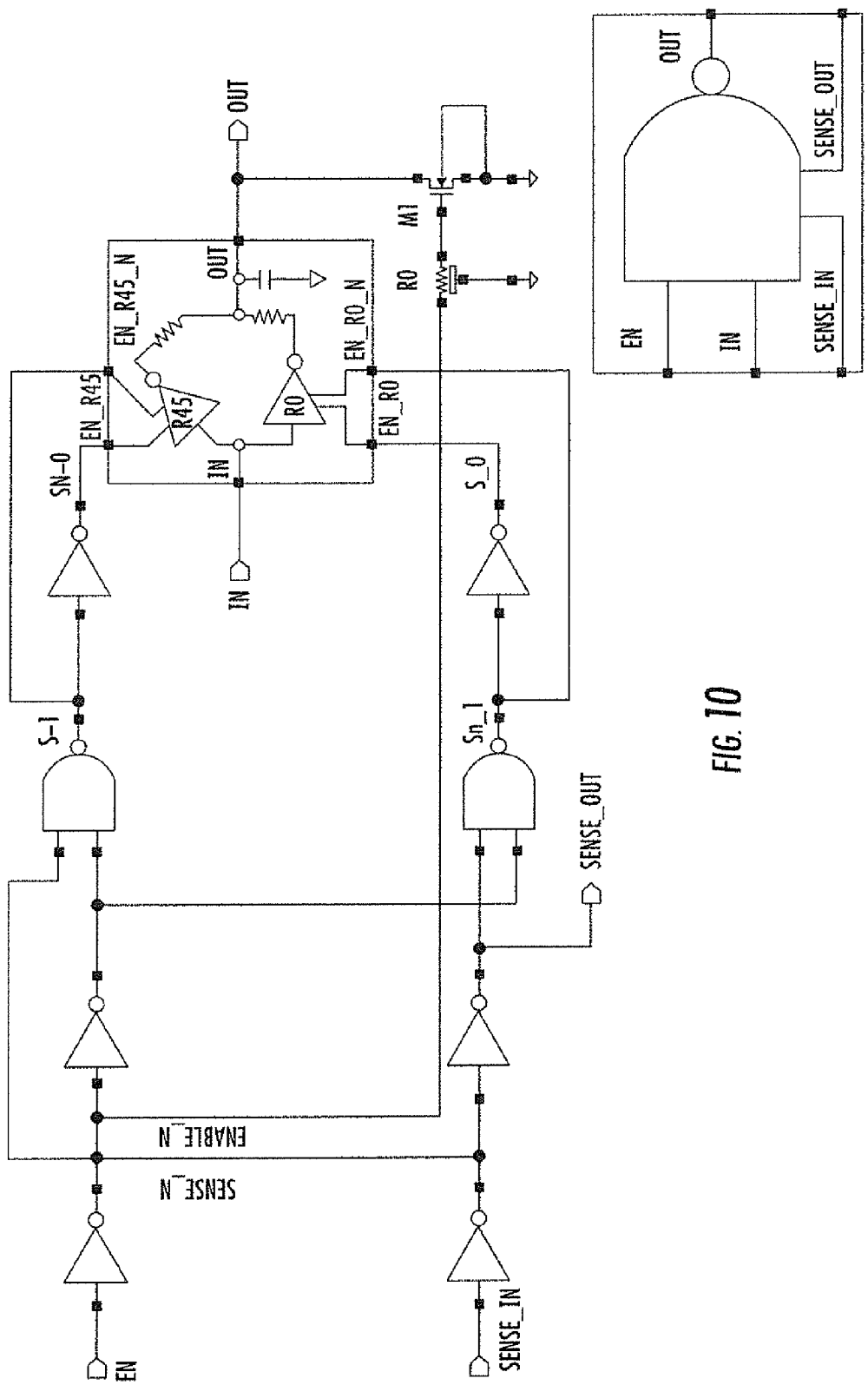
FIG. 10 shows a circuit diagram and related symbolic representation and control signals of an input NAND circuit embodiment for the first basic inverter module of FIG. 7 of an odd plurality of similar inverter modules connected to form respective ring oscillator circuits of the sensor device of the invention.

FIG. 10 shows a circuit diagram and related symbolic representation and control signals of an exemplary input NAND circuit embodiment of a first basic inverter module of FIG. 7 of an odd numbered of a plurality of similar inverter modules serially connected to form respective ring oscillator circuits of the sensor device.

Figure 11:
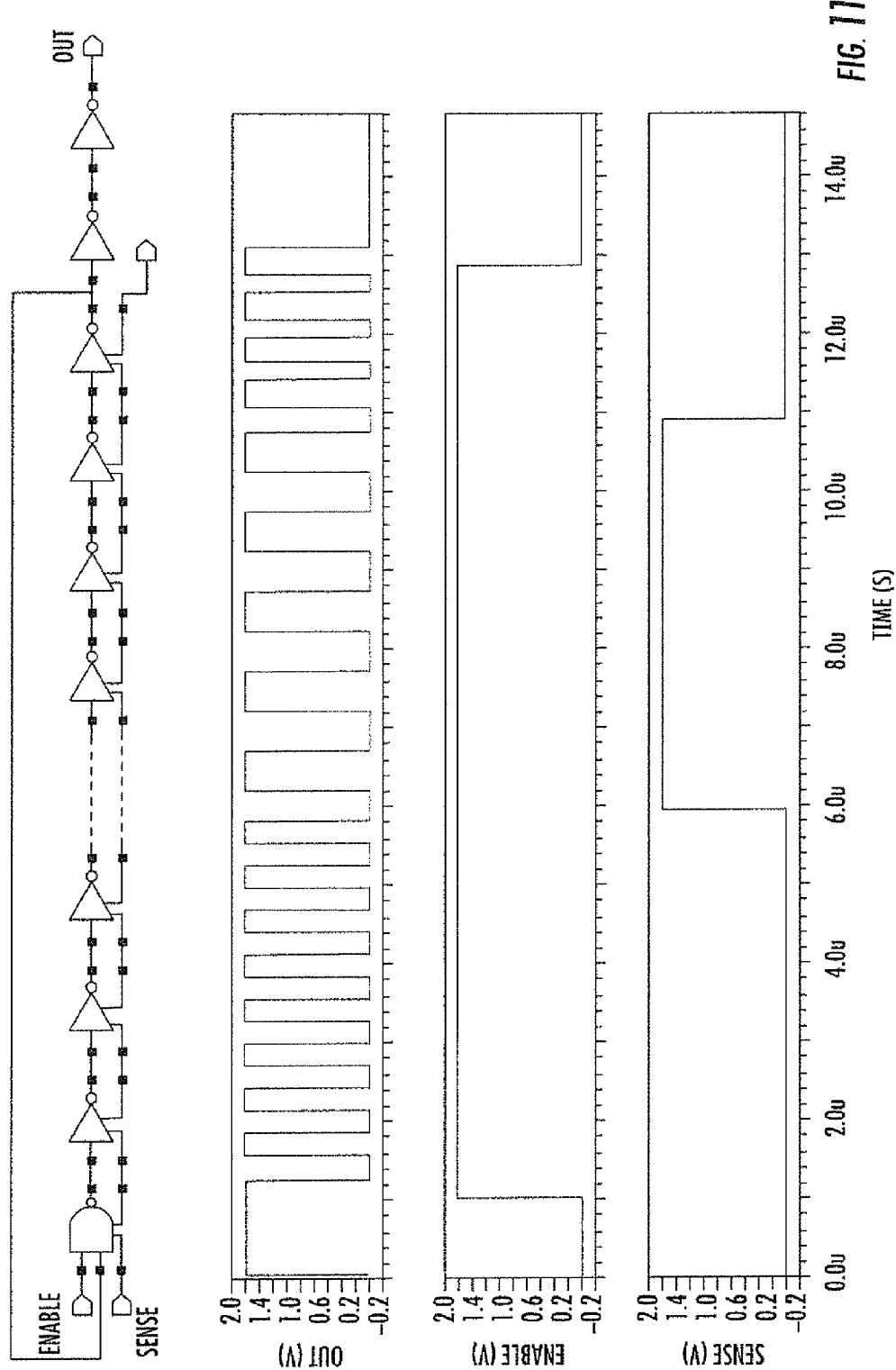
FIG. 11 is a symbolic representation of the selectable two signal path ring oscillator of the invention, and of a timing diagram of significant digital signals of the stress sensitive device based thereon.

A digital Enable signal controls the start of the oscillation of the ring oscillator structure depicted in FIG. 11, the normally enabled signal path of which is through the ring including the left hand side inverters as depicted in FIGS. 8 and 9, made of transistors and resistors with a 45° spatial orientation that have a low sensitivity to mechanical stress of the semiconductor crystal. The resulting frequency of oscillation relatively close to the design frequency provides a spread and temperature compensated reference.

A digital Sense signal switches the enabled signal path to pass through the ring including right hand side inverter as depicted in FIGS. 8 and 9. The right hand side inverter is made of transistors and resistors with a usual spatial orientation that are strongly affected by mechanical stress of the semiconductor crystal to exhibit a faster transition time due to the piezoelectric effects, and related increase of carrier mobility that proportionately increases the frequency of oscillation of the ring oscillator.

The operation of the input NAND circuit may be resumed as follows. When the Enable signal is High and Sense is Low, the signal path in the ring structure is through the right hand side inverter stage of the inverter modules. In this condition, if the die is stressed the oscillating frequency will be higher than the design frequency.

By switching the Sense signal to High, the signal path in the ring structure is through the left hand side inverter stage of the inverter modules. In this condition, the frequency less affected by the mechanical stress of the die is almost equal to the design frequency.

This is graphically illustrated in the timing diagram of FIG. 11. As depicted in FIG. 11, the device pressure or equivalent mechanical load may be sensed using only two digital control signal inputs, and by acquiring one oscillating signal as an output. The solid state sensor architecture has low power consumption due to the use of CMOS gates and a limited computation requirement for data elaboration. A ratio between the frequency read while the Sense signal is Low and the frequency read while the Sense signal is High, provides a measure of the pressure or load that causes a proportionate mechanical stress in the semiconductor crystal die.

The invention claimed is:

1. A solid state sensor configured to sense pressure comprising:
   a semiconductor substrate having a crystallographic design axis;
   an odd number of identical inverter modules coupled in series to form a ring oscillator on said semiconductor substrate;
   each inverter module comprising a pair of structurally identical CMOS inverter stages comprising a plurality of MOS transistors and resistors, with each MOS transistor comprising a channel, with each resistor having a longitudinal axis, and with a spatial orientation of said plurality of transistor channels and the longitudinal axes of said plurality of resistors being oriented parallel to the crystallographic design axis at an angle from it, respectively, and having rise and fall times less affected and more affected, respectively, by pressure; and
   a logic input circuit configured to start oscillation of said ring oscillator and select a signal propagation path therein, either through CMOS inverter stages more affected by the induced mechanical stress or through CMOS inverter stages less affected by the pressure, using two logic command signals;
   said ring oscillator being configured to allow reading of a frequency of oscillation based on the two logic command signals.

2. The solid state sensor of claim 1, wherein the crystallographic design axis comprises a [110] axis and the spatial orientation at an angle therefrom corresponds to a crystallographic axis [100].

3. The solid state sensor of claim 1, wherein said logic input circuit comprises a plurality of NAND gates coupled together.

4. The solid state sensor of claim 1, wherein a quantitative measure of the pressure is derivable from a ratio between the frequencies read based on the two logic command signals, with the two logic command signals corresponding to two selectable conditions of said ring oscillator.

5. A solid state sensor configured to sense pressure comprising:
   a semiconductor substrate having a crystallographic design axis;
   a plurality of inverter modules coupled in series to form a ring oscillator on said semiconductor substrate;
   each inverter module comprising a pair of CMOS inverter stages comprising a plurality of first and second devices, with said plurality of first devices being oriented parallel to the crystallographic design axis and with said plurality of second devices being oriented at an angle from the crystallographic design axis it, and having rise and fall times less affected and more affected, respectively, by pressure; and
   a logic input circuit configured to start oscillation of said ring oscillator and select a signal propagation path therein, either through CMOS inverter stages more affected by the induced mechanical stress or through CMOS inverter stages less affected by the pressure, using two logic command signals;
   said ring oscillator being configured to allow reading of a frequency of oscillation based on the two logic command signals.

6. The solid state sensor of claim 5, wherein said plurality of first devices comprises a plurality of MOS transistors, and said plurality of second devices comprises a plurality of resistors, with each MOS transistor comprising a channel, with each resistor having a longitudinal axis, and with the spatial orientation of said plurality of transistor channels being oriented parallel to the crystallographic design axis and with the longitudinal axes of said plurality of resistors being oriented at the angle from the crystallographic design axis.

7. The solid state sensor of claim 5, wherein said CMOS inverter stages in said pair of CMOS inverter stages are structurally identical.

8. The solid state sensor of claim 5, wherein the crystallographic design axis comprises a [110] axis and the spatial orientation at an angle therefrom corresponds to a crystallographic axis [100].

9. The solid state sensor of claim 5, wherein said logic input circuit comprises a plurality of NAND gates coupled together.

10. The solid state sensor of claim 5, wherein a quantitative measure of the pressure is derivable from a ratio between the frequencies read based on the two logic command signals, with the two logic command signals corresponding to two selectable conditions of said ring oscillator.

11. A method of making a solid state sensor configured to sense pressure comprising:
   forming an odd number of identical inverter modules coupled in series to form a ring oscillator on a semiconductor substrate having a crystallographic design axis, and forming each inverter module comprising
      forming a pair of structurally identical CMOS inverter stages comprising a plurality of MOS transistors and resistors, with each MOS transistor comprising a channel, with each resistor having a longitudinal axis, and with a spatial orientation of the plurality of transistor channels and the longitudinal axes of the plurality of resistors being oriented parallel to the crystallographic design axis at an angle from it, respectively, and having rise and fall times less affected and more affected, respectively, by pressure; and forming a logic input circuit configured to start oscillation of the ring oscillator and select a signal propagation path therein, either through CMOS inverter stages more affected by the induced mechanical stress or through CMOS inverter stages less affected by the pressure, using two logic command signals;

the ring oscillator being configured to allow reading of a frequency of oscillation based on the two logic command signals.

12. The method of claim 11, wherein the crystallographic design axis comprises a [110] axis and the spatial orientation at an angle therefrom corresponds to a crystallographic axis [100].

13. The method of claim 11, wherein the logic input circuit comprises a plurality of NAND gates coupled together.

14. The method of claim 11, wherein a quantitative measure of the pressure is derivable from a ratio between the frequencies read based on the two logic command signals, with the two logic command signals corresponding to two selectable conditions of said ring oscillator.

* * * * *